United States Patent
Houng et al.

(10) Patent No.: US 7,561,093 B2
(45) Date of Patent: Jul. 14, 2009

(54) ANALOG-TO-DIGITAL (AD) CONVERTER USING RESONANCE FREQUENCY SHIFTING AND VOLTAGE DETECTING DEVICE THEREOF

(75) Inventors: Young-Tack Houng, Suwon-si (KR); Sang-Wook Kwon, Seongnam-si (KR); In-Sang Song, Seoul (KR); Seung Seob Lee, Daejeon (KR); Kangwon Lee, Daejeon (KR); Seok Woo Lee, Gongju-si (KR); Phillip Lee, Seoul (KR)

(73) Assignees: Samsung Electronics Co., Ltd., Suwon-Si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 12/048,499

(22) Filed: Mar. 14, 2008

(65) Prior Publication Data
US 2009/0096651 A1      Apr. 16, 2009

(30) Foreign Application Priority Data
Oct. 10, 2007   (KR)   ............... 10-2007-0101956

(51) Int. Cl.
*H03M 1/36* (2006.01)
(52) U.S. Cl. ..................... 341/159; 341/160
(58) Field of Classification Search .......... 341/159–160
See application file for complete search history.

(56) References Cited

U.S. PATENT DOCUMENTS

| | | | |
|---|---|---|---|
| 6,373,423 B1 * | 4/2002 | Knudsen ..................... | 341/159 |
| 6,570,468 B2 * | 5/2003 | Ma et al. .................... | 333/188 |
| 6,958,566 B2 * | 10/2005 | Nguyen et al. ............. | 310/321 |

* cited by examiner

*Primary Examiner*—Khai M Nguyen
(74) *Attorney, Agent, or Firm*—DLA Piper LLP US

(57) ABSTRACT

An analog-to-digital (AD) converter and a voltage detecting device thereof are provided. The AD converter includes at least one voltage detecting device which outputs a signal of a frequency determined based on a magnitude of an input voltage using a resonance frequency of a resonator. The AD converter determines a digital output value depending on the output signal from the voltage detecting device. Therefore, the AD converter can achieve a high resolution and a high speed with far less power consumption.

19 Claims, 12 Drawing Sheets

FIG. 7

| Decimal number | 0 | 1 | 2 | 3 | 4 | 5 | 6 | 7 |
|---|---|---|---|---|---|---|---|---|
| Thermometer code | 0 | 0 | 0 | 0 | 0 | 0 | 0 | 1 |
| | 0 | 0 | 0 | 0 | 0 | 0 | 1 | 1 |
| | 0 | 0 | 0 | 0 | 0 | 1 | 1 | 1 |
| | 0 | 0 | 0 | 0 | 1 | 1 | 1 | 1 |
| | 0 | 0 | 0 | 1 | 1 | 1 | 1 | 1 |
| | 0 | 0 | 1 | 1 | 1 | 1 | 1 | 1 |
| | 0 | 1 | 1 | 1 | 1 | 1 | 1 | 1 |
| Binary code (3 bits) | 0 | 0 | 0 | 0 | 1 | 1 | 1 | 1 |
| | 0 | 0 | 1 | 1 | 0 | 0 | 1 | 1 |
| | 0 | 1 | 0 | 1 | 0 | 1 | 0 | 1 |

FIG. 10

Binary code

| Decimal number | 0 | 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|---|---|
| Binary code | 0 | 0 | 0 | 0 | 0 | 0 | 0 | 0 | 1 | 1 | 1 | 1 | 1 | 1 | 1 | 1 | MSB |
|  | 0 | 0 | 0 | 0 | 1 | 1 | 1 | 1 | 0 | 0 | 0 | 0 | 1 | 1 | 1 | 1 |  |
|  | 0 | 0 | 1 | 1 | 0 | 0 | 1 | 1 | 0 | 0 | 1 | 1 | 0 | 0 | 1 | 1 |  |
|  | 0 | 1 | 0 | 1 | 0 | 1 | 0 | 1 | 0 | 1 | 0 | 1 | 0 | 1 | 0 | 1 | LSB |

FIG. 11

| Bits | Number of filters |
|---|---|
| 4 | 15 |
| 5 | 31 |
| 6 | 63 |
| 7 | 127 |
| 8 | 255 |
| N | $2^N - 1$ |

FIG. 14

| Decimal number | 0 | 1 | 3 | 2 | 6 | 7 | 5 | 4 | 12 | 13 | 15 | 14 | 10 | 11 | 9 | 8 | |
|---|---|---|---|---|---|---|---|---|---|---|---|---|---|---|---|---|---|
| Gray code | 0 | 0 | 0 | 0 | 0 | 0 | 0 | 0 | 1 | 1 | 1 | 1 | 1 | 1 | 1 | 1 | MSB |
| | 0 | 0 | 0 | 0 | 1 | 1 | 1 | 1 | 1 | 1 | 1 | 1 | 0 | 0 | 0 | 0 | |
| | 0 | 0 | 1 | 1 | 1 | 1 | 0 | 0 | 0 | 0 | 1 | 1 | 1 | 1 | 0 | 0 | |
| | 0 | 1 | 1 | 0 | 0 | 1 | 1 | 0 | 0 | 1 | 1 | 0 | 0 | 1 | 1 | 0 | LSB |

Gray code

FIG. 15

| Bits | Number of filters |
|---|---|
| 4 | 8 |
| 5 | 16 |
| 6 | 32 |
| 7 | 64 |
| 8 | 128 |
| N | $2^{N-1}$ |

ANALOG-TO-DIGITAL (AD) CONVERTER USING RESONANCE FREQUENCY SHIFTING AND VOLTAGE DETECTING DEVICE THEREOF

CROSS-REFERENCE TO RELATED APPLICATIONS

This application claims priority from Korean Patent Application No. 2007-101956 filed on Oct. 10, 2007 in the Korean Intellectual Property Office, the entire disclosure of which is incorporated herein by reference.

BACKGROUND OF THE INVENTION

1. Field of the Invention

The present invention relates to an analog-to-digital (AD) converter and a voltage detecting device. More particularly, the present invention relates to a parallel AD converter which converts an analog signal to a digital signal using a micro electro mechanical systems (MEMS) technology, and a voltage detecting device thereof.

2. Description of the Related Art

Many natural signals change in an analog (continuous) manner on a time basis. To understand the phenomena of nature, it is required to measure the magnitude of the analog signals on the time basis. The measured values are processed and analyzed using computers. To process and analyze the analog signal using the computer, a device is required to convert the analog signal to a digital value processable by the computer. This device is an analog-to-digital (AD) converter.

The AD converter may be fabricated using a micro electro mechanical systems (MEMS) technology. The MEMS is also referred to as a micro system, a micro machine, a micro mechatronics, and so forth, which indicates a micro system or a micro machine. Namely, a device can be manufactured using the MEMS technology. The AD converter can be miniaturized using the MEMS technology.

Types of the AD converter include a parallel comparator type, a single-slop type, a dual-slope type, a successive approximation type, and so on. The parallel comparator AD converter uses an OP amplifier as the comparator, and outputs a digital value of the binary code by encoding the output signal of the comparator. When an input voltage is higher than a reference voltage, the comparator outputs a voltage corresponding to the logical value 1.

The parallel comparator AD converter includes a plurality of resistances for setting the reference voltages, a plurality of comparators for comparing the voltages with the reference voltage, and an encoder for outputting a digital signal.

However, when the AD converter includes the multiple resistances and the multiple comparators, the resistances and the comparators consume too much power. Also, to implement a high resolution and a high speed, more resistances and comparators are required, which causes the greater power consumption. Specifically, to implement an n-bit AD converter, $2^n$-ary resistances and $(2^n-1)$-ary comparators are required. As the AD converter of the higher bits is implemented, the power consumption exponentially increases.

It is preferred that the AD converter consumes less power. Therefore, what is needed is an AD converter for achieving the high resolution and the high speed with the lower power consumption.

SUMMARY OF THE INVENTION

Exemplary embodiments of the present invention address at least the above problems and/or disadvantages and provide at least the advantages described below.

The present invention has been provided to address the above-mentioned and other problems and disadvantages occurring in the conventional arrangement, and an aspect of the present invention is to provide an AD converter for achieving the high resolution and the high speed with the lower power consumption. The AD converter determines a digital output value according to a resonance frequency set based on a magnitude of an input voltage.

According to an aspect of the present invention, there is provided an analog-to-digital (AD) converter which includes at least one voltage detecting device for outputting a signal of a frequency determined based on a magnitude of an input voltage; and a digital signal generator for determining a digital output value according to an output signal from the voltage detecting device. The voltage detecting device includes a membrane to which the input voltage is applied; a resonator disposed away from the membrane by a certain distance for shifting a resonance frequency based on the magnitude of the input voltage applied to the membrane; and a detector for outputting a signal of the same frequency as the resonance frequency of the resonator.

The detector may include a conductive plate apart from the resonator by a certain distance, and the detector may output a voltage signal of the same frequency as the resonance frequency of the resonator.

The AD converter may further include a reference frequency generator. The reference frequency generator comprises a reference resonator for resonating at a reference frequency and a reference detector for outputting a signal of the same frequency as the reference frequency of the reference resonator, and generates a reference frequency signal using the reference resonator and the reference detector.

The digital signal generator may determine the digital output value by comparing the frequency of the output signal from the voltage detecting device with a magnitude of the reference frequency.

The digital signal generator may determine a thermometer code '1' when the frequency of the output signal is smaller than the reference frequency, and determine a thermometer code '0' when the frequency of the output signal is greater than the reference frequency.

The voltage detecting device corresponding to a lower bit may produce a lower frequency of the output signal.

The voltage detecting device corresponding to a lower bit may have a greater area overlapped by the membrane and the resonator, and produce a lower frequency of the output signal.

In the voltage detecting device corresponding to a lower bit, the membrane may be lengthened in one direction and an area overlapped by the membrane and the resonator may increase.

In the voltage detecting device corresponding to a lower bit, the resonator may be lengthened in one direction and the frequency of the output signal may be lowered.

The number of the voltage detecting devices may be one. The digital signal generator may include one or more band pass filters (BPFs) and determine the digital output value according to whether the output signal from the voltage detecting device passes through the BPFs.

The BPFs may constitute filter groups as many as bits of the digital output value, and BPFs belonging to one filter group may be connected with each other in parallel.

The filter group corresponding to an i-th bit (i is a natural number) may include $2^{i-1}$-ary BPFs.

The voltage detecting device may output the output signal of the frequency within an output frequency range between a minimum frequency and a maximum frequency which are output based on the input signal. When the output frequency range is divided to $2^i$-ary sub-regions, the filter group corresponding to the i-th bit may include $2^{i-1}$-ary BPFs which pass frequencies of even sub-regions.

The digital signal generator may output a binary code.

A filter group corresponding to a first bit may include one BPF, and a filter group corresponding to an i-th bit (i is a natural number greater than 2) may include $2^{i-2}$-ary BPFs.

The voltage detecting device may output the output signal of a frequency within an output frequency range between a minimum frequency and a maximum frequency which are output based on the input signal, a filter of the filter group corresponding to the first bit may pass frequencies of a first sub-region when the output frequency range is divided two sub-regions, and filters of the filter group corresponding to the i-th bit (i is a natural number greater than 2) may pass frequencies of (4j+2)-th and (4j+3)-th sub-regions (j is an integer and $0 \geq j < 2^{i-2}$) when the output frequency range is divided to $2^i$-ary sub-regions.

The digital signal generator may output a Gray code.

The digital signal generator may output the digital output value '1' of the filter group which passes the output signal, and output the digital output value '0' of the filter group which pass the output signal.

The digital signal generator may output the digital output value '0' of the filter group which passes the output signal, and output the digital output value '1' of the filter group which does not pass the output signal.

According to the aspect of the present invention, a voltage detecting device includes a membrane to which an input voltage is applied; a resonator disposed away from the membrane by a certain distance for shifting a resonance frequency based on a magnitude of the input voltage applied to the membrane; and a detector for outputting a signal of the same frequency as the resonance frequency of the resonator to produce a signal of a frequency determined based on the magnitude of the input voltage.

BRIEF DESCRIPTION OF THE DRAWING FIGURES

The above and other aspects of the present invention will be more apparent by describing certain exemplary embodiments of the present invention with reference to the accompanying drawings, in which:

FIG. 7 is a table of 3-bit thermometer codes and binary codes according to the embodiments of the present invention;

FIG. 10 is a table of binary code output values according to yet another embodiment of the present invention;

FIG. 11 is a table of the number of filters based on the bits of the AD converter according to yet another embodiment of the present invention;

FIG. 14 is a table of Gray code output values according to still another embodiment of the present invention; and FIG. 15 is a table of the number of filters based on the bits of the AD converter according to still another embodiment of the present invention.

Throughout the drawings, the same drawing reference numerals will be understood to refer to the same elements, features, and structures.

DETAILED DESCRIPTION OF THE EXEMPLARY EMBODIMENTS

Figure 1:
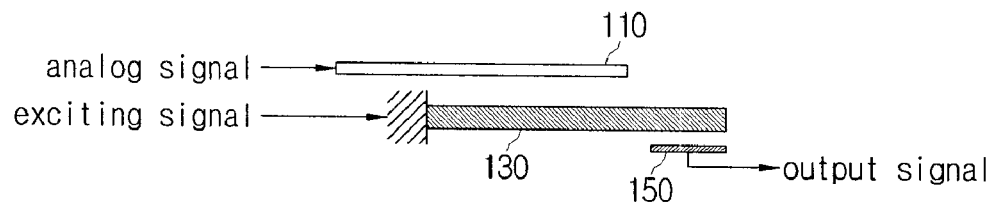
FIG. 1 is a front view of a structure of a voltage detecting device using a resonator according to an embodiment of the present invention.

Certain exemplary embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

Figure 2:
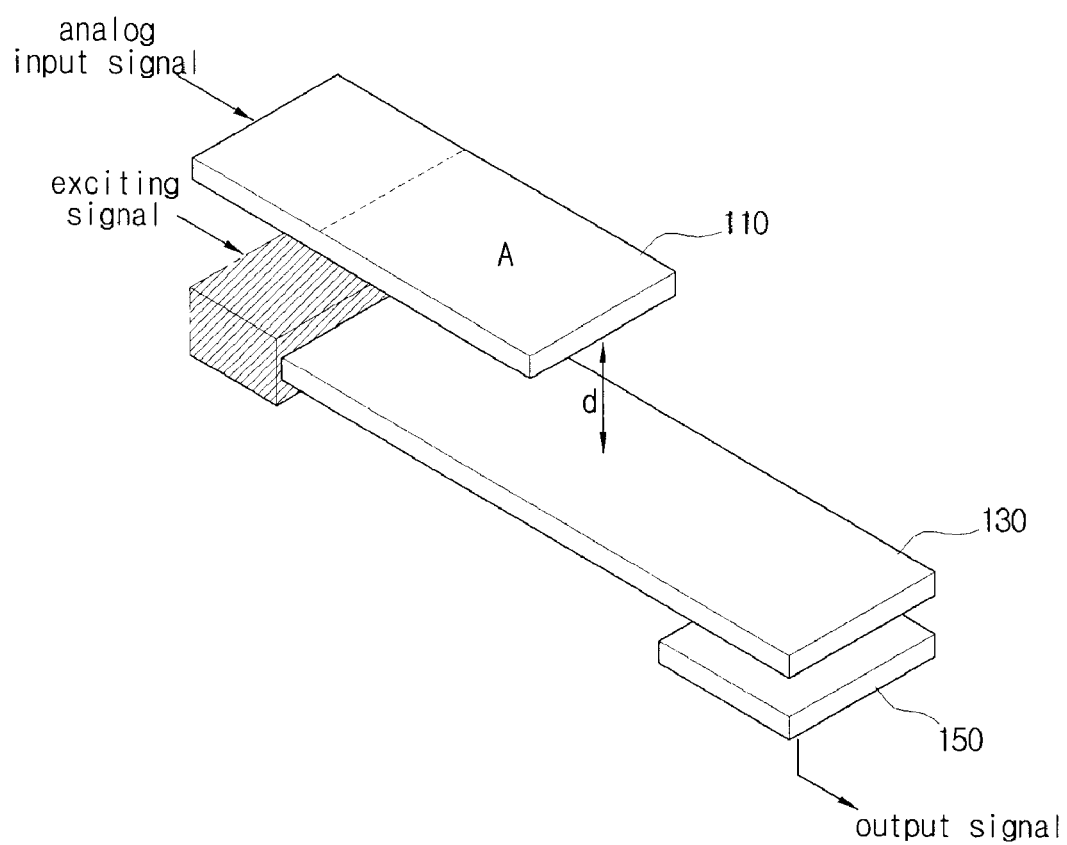
FIG. 2 is a perspective view of the voltage detecting device of FIG. 1.

FIGS. 1 and 2 are a front view and a perspective view of a voltage detecting device using a resonator according to an embodiment of the present invention. The voltage detecting device of FIG. 1 includes a membrane 110, a resonator 130, and a detector 150.

In FIG. 2, the membrane 110 is a conductor in the form of a thin rectangular plate. The membrane 110 is fixed. An analog signal input voltage is applied to the membrane 110.

The resonator 130 is a conductor in the form of a plate in a certain length. One side of the resonator 130 is fixed. The fixed side acts as the axis of the resonant vibration. When an exciting signal of a resonance frequency is applied to the resonator 130, the resonator 130 resonates vertically. The exciting signal generally uses a voltage signal of the same frequency as an intrinsic frequency of the resonator.

The resonator 130 is apart from the membrane 110 by a specific distance d. Accordingly, when the input voltage is applied to the membrane 110, the resonator 130 and the membrane 110 function as a capacitor.

When the voltage is applied to both plates of the capacitor, an electrostatic force is produced between the plates. Hence, when the input voltage is applied to the membrane 110, the resonator 130 changes the resonance frequency according to the electrostatic force. Specifically, the change of the resonance frequency based on the input voltage applied to the membrane 110 can be expressed as Equation 1.

The equation of motion of the resonating object of FIG. 1 can be expressed as Equation 1.

$$m\frac{d^2x}{dt^2} + kx = F \qquad \text{[Equation 1]}$$

In the equation of motion, the resonance frequency is $$\omega = \sqrt{\frac{k}{m}},$$

where k is an intrinsic elastic modulus and m is a mass of the resonator.

An external force F is the electrostatic force and its magnitude is acquired based on Equation 2.

$$F = \frac{1}{2}\frac{\partial C}{\partial x}V^2 = \frac{1}{2}\frac{\varepsilon A}{(d-x)^2}V^2 \cong \frac{\varepsilon A}{d^2}V^2 + \frac{\varepsilon A}{d^3}V^2 x \qquad \text{[Equation 2]}$$

When Equation 2 is substituted to Equation 1, $$m\frac{d^2x}{dt^2} + \left(k - \frac{\varepsilon A}{d^3}V^2\right) \cong \frac{1}{2}\frac{\varepsilon A}{d^2}V^2. \qquad \text{[Equation 3]}$$

The resonance frequency based on the equation of motion is calculated as below.

$$\omega_{res} = \sqrt{\frac{k+k_s}{m}} = \sqrt{\frac{k - \frac{\varepsilon A}{d^3}V^2}{m}} \qquad \text{[Equation 4]}$$

As the area A overlapped by the membrane 110 and the resonator 130, the voltage V, and the mass m of the resonator 130 increase, the resonance frequency $\omega_{res}$ lowers. Herein, k is the intrinsic elastic modulus of the resonator, m is the mass of the resonator, and ∈ is a permittivity of a dielectric between the membrane 110 and the resonator 130.

Thus, the higher input voltage of the analog signal, the lower resonance frequency. In addition, the resonance frequency can be controlled by changing the area overlapped by the membrane 110 and the resonator 130 or changing the mass of the resonator 130.

The detector 150 is a conductive plate in the form of a thin film. The detector 150 is apart from the resonator 130 by a certain distance. Hence, the detector 150 and the resonator 130 function as the capacitor to each other.

The capacitance is in proportion to the area of the two plates and in inverse proportion to the distance between the two plates. Accordingly, when the distance between the two plates changes, the capacitance also change in the inverse proportion. When the electric charge stored to the capacitor is constant, the capacitance is in inverse proportion to the voltage between the two plates. Thus, the distance between the two plates is proportional to the voltage applied to the capacitor.

When the resonator 130 resonates, one side the resonator 130 vibrates vertically. When the detector 150 is disposed in the one side of the resonator 130 by a certain distance, the distance between the resonator 130 and the detector 150 proportionally changes according to the vibration of the resonator 130. Since the voltage between the resonator 130 and the detector 150 is proportional to the distance as mentioned above, the voltage between the resonator 130 and the detector 150 also changes proportionally to the vibration of the resonator 130. In other words, the voltage of the detector 150 changes to the same frequency as the resonance frequency of the resonator 130. As a result, the detector 150 outputs the voltage signal of the same frequency as the resonance frequency.

In short, the greater analog signal input voltage, the lower resonance frequency of the resonator 130. The detector 150 outputs the voltage signal of the same frequency of the resonance frequency. Hence, using the frequency of the output voltage signal, the analog signal input voltage can be measured.

As such, the voltage detecting device of FIG. 1 can detect the voltage using the resonance frequency.

Now, an AD converter implemented using the voltage detecting device of FIGS. 1 and 2 is described in detail.

Figure 3:
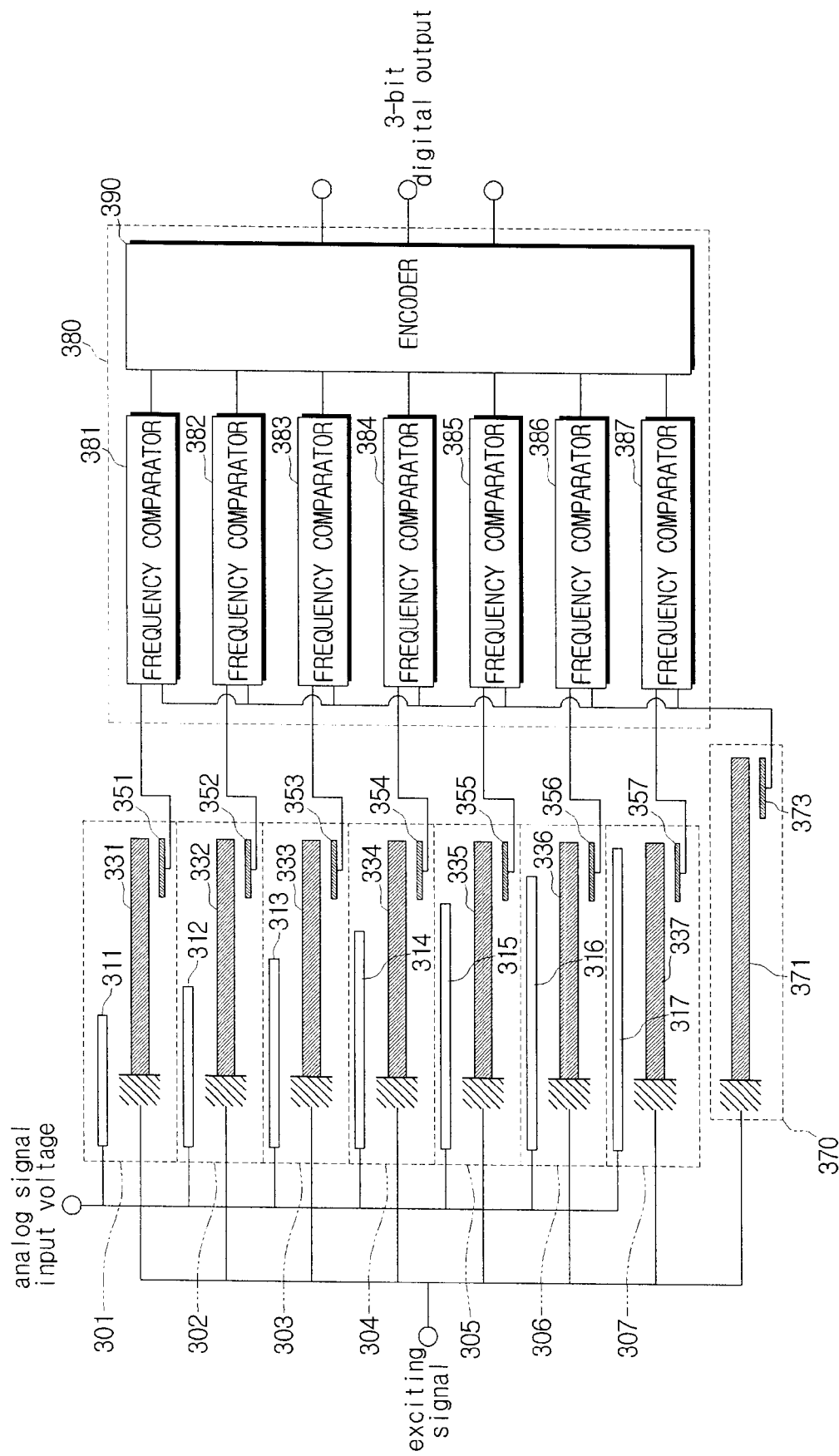
FIG. 3 is a diagram of a structure of a 3-bit AD converter which shifts a resonance frequency by changing a length of membranes according to one embodiment of the present invention.
Figure 4:
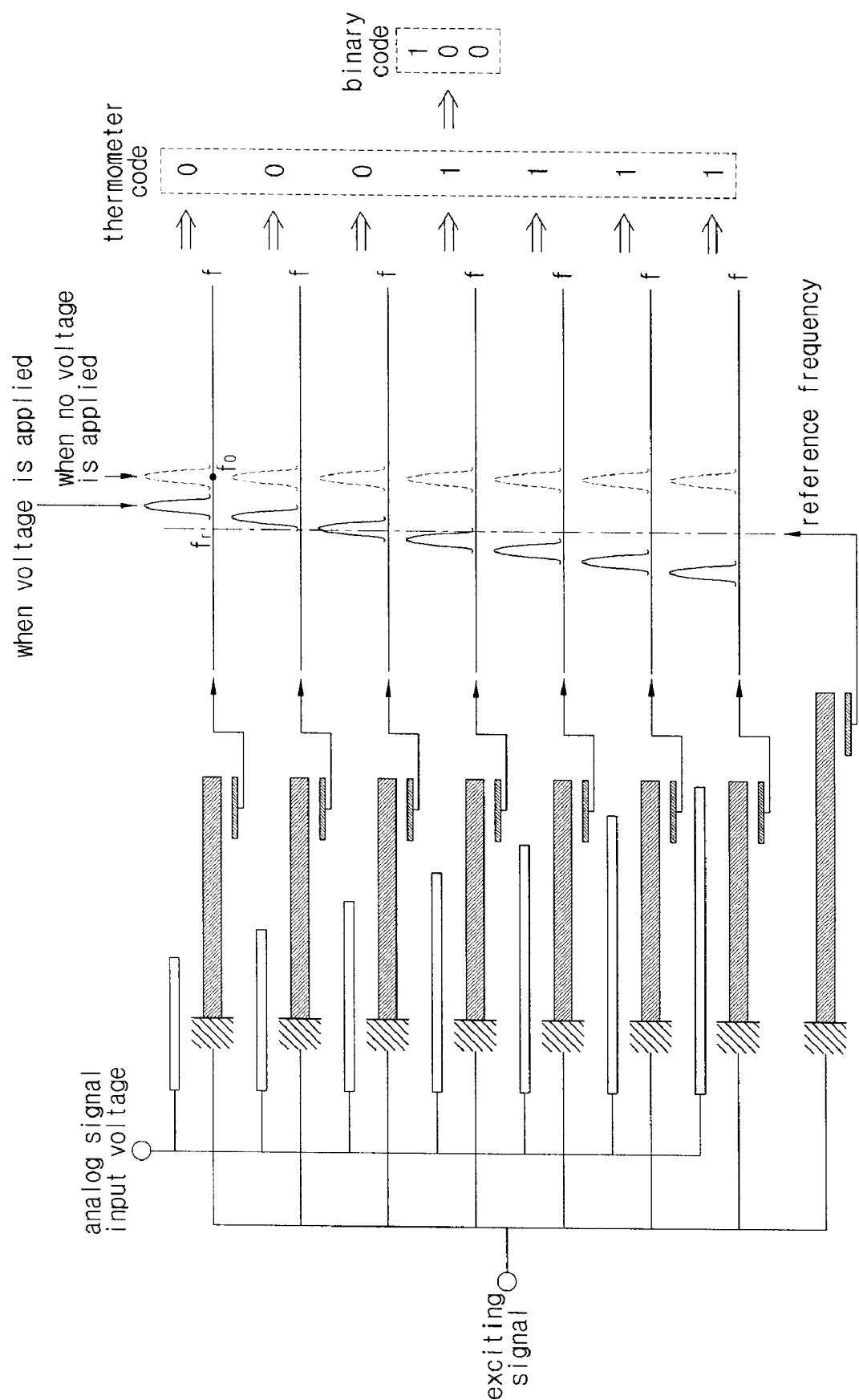
FIG. 4 is a diagram of a frequency of the output signal according to one embodiment of the present invention.

According to one embodiment of the present invention, a 3-bit AD converter is illustrated by referring to FIGS. 3 and 4. FIG. 3 is a diagram of a structure of a 3-bit AD converter which shifts a resonance frequency by changing a length of membranes according to one embodiment of the present invention.

The 3-bit AD converter of FIG. 3 includes seven voltage detecting devices 301 through 307, a reference frequency generator 370, and a digital signal generator 380.

The voltage detecting device at the top corresponds to the highest bit of the thermometer code. The voltage detecting devices below correspond to lower bits.

In FIGS. 3 and 4, the voltage detecting devices 301 through 307 are referred to as a first voltage detecting device 301 through a seventh voltage detecting device 307 in order. The membranes of the voltage detecting devices 301 through 307 are referred to as a first membrane 311 through a seventh membrane 317 in order. The resonators are referred to as a first resonator 331 through a seventh resonator 337 in order. The detectors are referred to as a first detector 351 through a seventh detector 357. The frequency comparators are referred to as a first frequency comparator 381 through a seventh frequency comparator 387.

The voltage detecting devices 301 through 307 of FIG. 3 each include the membrane, the resonator, and the detector. The length of the membranes 311 through 317 of the voltage detecting devices 301 through 307 increases to the right as progressing from the higher bit to the lower bit. Accordingly, the voltage detecting device corresponding to the lower bit has the greater area A overlapped by the membrane and the resonator.

Based on Equation 4, the greater area overlapped by the membrane and the resonator, the lower resonance frequency. Consequently, the voltage detecting device corresponding to the lower bit outputs the voltage signal of the lower frequency.

The reference frequency generator 370 includes a reference resonator 371 and a reference detector 373. When the exciting signal is applied, the reference resonator 371 vibrates at the resonance frequency corresponding to the intrinsic frequency. The reference detector 373 outputs a reference voltage signal of the same frequency as the resonance frequency of the reference resonator 371. The reference voltage signal is the basis compared with the output signals of the voltage detecting devices 301 through 307.

The digital signal generator 380 includes seven frequency comparators 381 through 387, and an encoder 390. The frequency comparators 381 through 387 compare the output signal from the voltage detecting devices 301 through 307 with the reference frequency. When the frequency of the output signal is smaller than the reference frequency, the frequency comparators 381 through 387 output the voltage corresponding to the thermometer code '1'. When the frequency of the output signal is greater than the reference frequency, the frequency comparators 381 through 387 output the voltage corresponding to the thermometer code '0'. That is, the combination of the signals output from the frequency comparators 381 through 387 becomes the thermometer code.

The thermometer code represents a code starting from the least significant bit '1' in sequence, like the thermometer. For example, '0000001' represents the decimal number '1' and '0000011' represents the decimal number '2'. Since the value is expressed by changing to '1' from the least significant bit in sequence, the thermometer code of M-ary ciphers has (M+1)-ary patterns. For example, in Table of FIG. 7, the thermometer code of seven ciphers can express eight decimal numbers from '0' to '7'.

The frequency comparator can be implemented using a general frequency comparator.

The encoder 390 converts the thermometer code output from the frequency comparators 381 through 387 to a binary code. As the thermometer code of seven ciphers is input in FIG. 3, a 3-bit binary code is output as the digital output value.

Hereafter, the frequency distribution of the output signals from the voltage detecting devices 301 through 307 is explained by referring to FIG. 4. FIG. 4 depicts the frequency of the output signal according to one embodiment of the present invention. The reference numerals of FIG. 4 are the same as in FIG. 3 and thus omitted in FIG. 4.

The output of the first voltage detecting device 301 at the top in FIG. 4 is described first. When no voltage is applied, the first voltage detecting device 301 outputs the output signal of the frequency $f_0$. When the voltage is applied, the first voltage detecting device 301 outputs the output signal of the frequency lower than $f_0$. This is because the resonance frequency of the first resonator 331 is lowered as the voltage increases based on Equation 4.

However, since the frequency of the output signal of the first voltage detecting device 301 is higher than the reference frequency, the first frequency comparator 381 outputs the thermometer code '0'.

Likewise, since the frequency of the output signals from the second voltage detecting device 302 and the third voltage detecting device 303 is higher than the reference frequency, the second frequency comparator 382 and the third frequency comparator 383 output the thermometer code '0'.

By contrast, since the frequency of the output signals from the four voltage detecting device 304 through the seventh voltage detecting device 307 is lower than the reference frequency, the fourth frequency comparator 384 through the seventh frequency comparator 387 output the thermometer code '1'.

Therefore, the thermometer code in FIG. 4 is '0001111' and the binary code is '100' based on the table of FIG. 7. The thermometer code is converted by the encoder 390, and the digital signal generator 380 finally outputs the digital output value '100'.

The higher input voltage applied, the lower frequency of the output signals from the voltage detecting devices 301 through 307. Hence, as the input voltage increases, the number of '1's in the thermometer code also increases. In other words, as the input voltage increases, the digital signal generator 380 outputs the binary code corresponding to the higher number.

As above, the analog signal can be converted to the digital signal by changing the resonance frequency based on the input voltage with the different lengths of the membranes 311 through 317.

Figure 5:
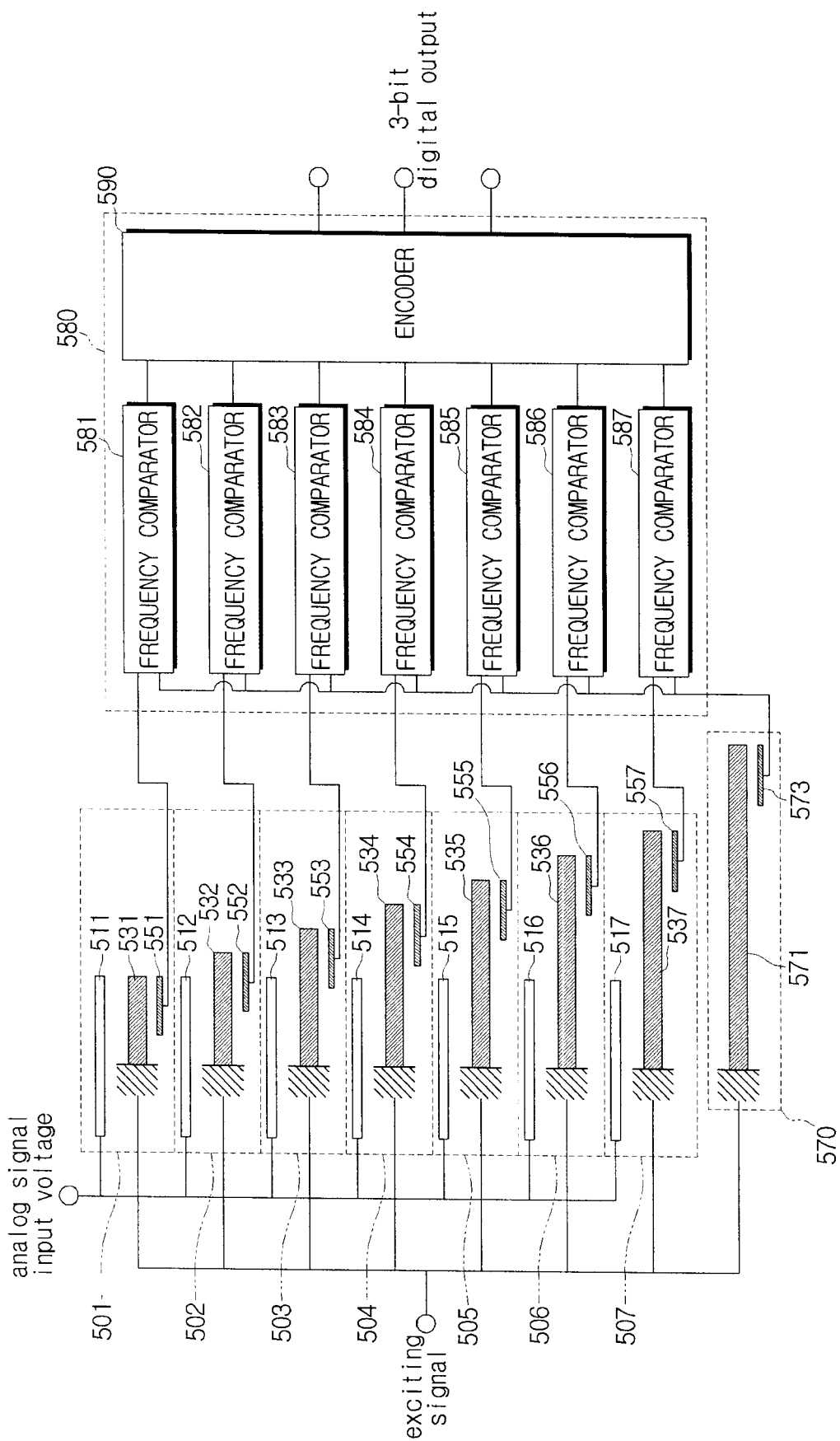
FIG. 5 is a diagram of a structure of a 3-bit AD converter which shifts a resonance frequency by changing a length of membranes according to another embodiment of the present invention.
Figure 6:
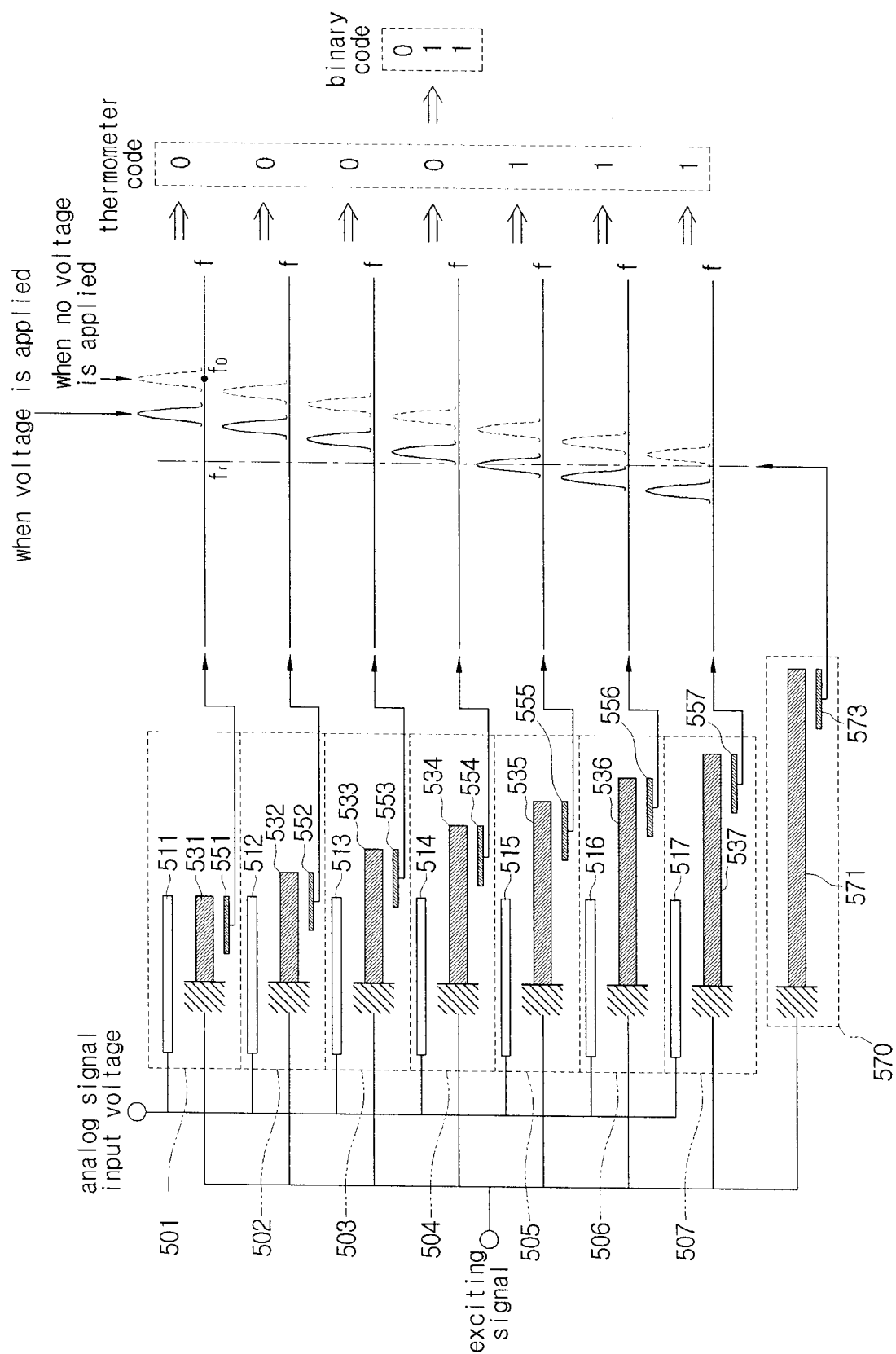
FIG. 6 is a diagram of a frequency of the output signal according to another embodiment of the present invention.

Now, a 3-bit AD converter according to another embodiment of the present invention is illustrated by referring to FIGS. 5 and 6. FIG. 5 is a diagram of a structure of the 3-bit AD converter which shifts a resonance frequency by changing a length of resonator according to another embodiment of the present invention.

The 3-bit AD converter of FIG. 5 includes seven voltage detecting devices 501 through 507, a reference frequency generator 570, and a digital signal generator 580.

The voltage detecting device at the top in FIG. 5 corresponds to the highest bit of the thermometer code. The voltage detecting devices below correspond to the lower bits.

In FIGS. 5 and 6, the voltage detecting devices 501 through 507 are referred to as a first voltage detecting device 501 through a seventh voltage detecting device 507 in order. The membranes of the voltage detecting devices 501 through 507 are referred to as a first membrane 511 through a seventh membrane 517 in order. The resonators are referred to as a first resonator 531 through a seventh resonator 537 in order. The detectors are referred to as a first detector 551 through a seventh detector 557. The frequency comparators are referred to as a first frequency comparator 581 through a seventh frequency comparator 587.

Unlike the one embodiment of the present invention of FIG. 3, the length of the membranes 511 through 517 of the voltage detecting devices 501 through 507 is constant, and the length of the resonators 531 through 537 increases to the right as progressing from the higher bit to the lower bit. Hence, in the voltage detecting device corresponding to the lower bit, the mass m of the resonator increases.

Based on Equation 4, the greater mass m of the resonator, the lower resonance frequency. Accordingly, the voltage detecting device corresponding to the lower bit outputs the voltage signal of the lower frequency.

The reference frequency generator 570 outputs a reference voltage signal of the same frequency as the resonance frequency of the reference resonator 571 through a reference detector 573. The reference voltage signal is the basis for comparing with the output signals of the voltage detecting devices 501 through 507.

The digital signal generator 580 includes seven frequency comparators 581 through 587 and an encoder 590. Similar to the one embodiment of the present invention of FIG. 3, when the frequency of the output signal is smaller than the reference frequency, the comparators 581 through 587 of the digital signal generator 580 output the voltage corresponding to the thermometer code '1'. When the frequency of the output signal is greater than the reference frequency, the comparators 581 through 587 output the voltage corresponding to the thermometer code '0'.

The encoder 590 converts the thermometer code output from the frequency comparators 581 through 587 to a binary code. Since the thermometer code of the seven ciphers is input in FIG. 5, a 3-bit binary code is output as the digital output value.

Now, the frequency distribution of the output signals from the voltage detecting devices 501 through 507 is explained by referring to FIG. 6. FIG. 6 depicts the frequency of the output signal according to another embodiment of the present invention. The reference numerals in FIG. 6 are the same as in FIG. 5 and thus omitted.

The output of the first voltage detecting device 501 at the top in FIG. 6 is illustrated first. When no voltage is applied, the first voltage detecting device 501 outputs the output signal of the frequency $f_0$. When the voltage is applied, the first voltage detecting device 501 outputs the output signal of the frequency lower than $f_0$. This is because the resonance frequency of the first resonator 531 lowers as the voltage increases based on Equation 4.

Yet, since the frequency of the output signal of the first voltage detecting device 501 is higher than the reference frequency, the first frequency comparator 581 outputs the thermometer code '0'.

Unlike FIG. 4, when no voltage is applied, the resonance frequency lowers as progressing to the lower bits in FIG. 6. This is because the length of the resonators 531 through 537 increases as progressing to the lower bits. Also, when the voltage is applied, the resonance frequency lowers as progressing to the lower bits.

Since the frequency of the output signals from the second voltage detecting device 502 through the fourth voltage detecting device 504 is higher than the reference frequency, the second frequency comparator 582 through the fourth frequency comparator 584 output the thermometer code '0'.

By contrast, since the frequency of the output signals from the fifth voltage detecting device 505 through the seventh voltage detecting device 507 is lower than the reference frequency, the fifth frequency comparator 585 through the seventh frequency comparator 587 output the thermometer code '1'.

Therefore, the thermometer code in FIG. 6 is '0000111'. Based on the table of FIG. 7, the binary code is '011'. The thermometer code is converted by the encoder 590, and the digital signal generator 580 finally outputs the digital output value '011'.

The higher input voltage applied, the lower frequency of the output signals from the voltage detecting devices 501 through 507. Hence, as the input voltage increases, the number of '1's in the thermometer code increases. That is, with the higher input voltage, the digital signal generator 580 outputs the binary code corresponding to the higher number.

As above, the analog signal can be converted to the digital signal by shifting the resonance frequency depending on the input voltage with the different lengths of the resonators 531 through 537.

FIG. 7 is a table of 3-bit thermometer codes and binary codes according to the embodiments of the present invention.

The 3-bit thermometer codes in FIG. 7 include seven ciphers and have eight patterns from the decimal number '0' to '7'.

So far, the AD converter including the plurality of the voltage detecting devices has been described by referring to FIGS. 3 through 7.

In the above embodiments of the present invention, when the frequency of the output signal is higher than the reference frequency, '0' is determined, and when the frequency of the output signal is lower than the reference signal, '1' is determined. Note that the opposite determinations are possible. Specifically, when the frequency of the output signal is higher than the reference frequency, the thermometer code '1' can be determined, and when the frequency of the output signal is lower than the reference signal, the thermometer code '0' can be determined.

While the membranes are lengthened as progressing to the lower bits, their length can be shortened. That is, as progressing to the lower bits, the membranes may be shortened.

While the resonators are lengthened as progressing to the lower bits, they may be shortened.

While the reference frequency generator includes the resonator and the detector, the reference frequency generator can be differently constructed. For example, the reference frequency generator may employ a general signal generator.

While the 3-bit AD converter is employed, AD converters of other bits can be applied. To implement an N-bit AD converter, $(2^N-1)$-ary voltage detecting devices are required.

Hereafter, an AD converter using a band pass filter (BPF) is explained by referring to FIGS. 8 through 15.

Figure 8:
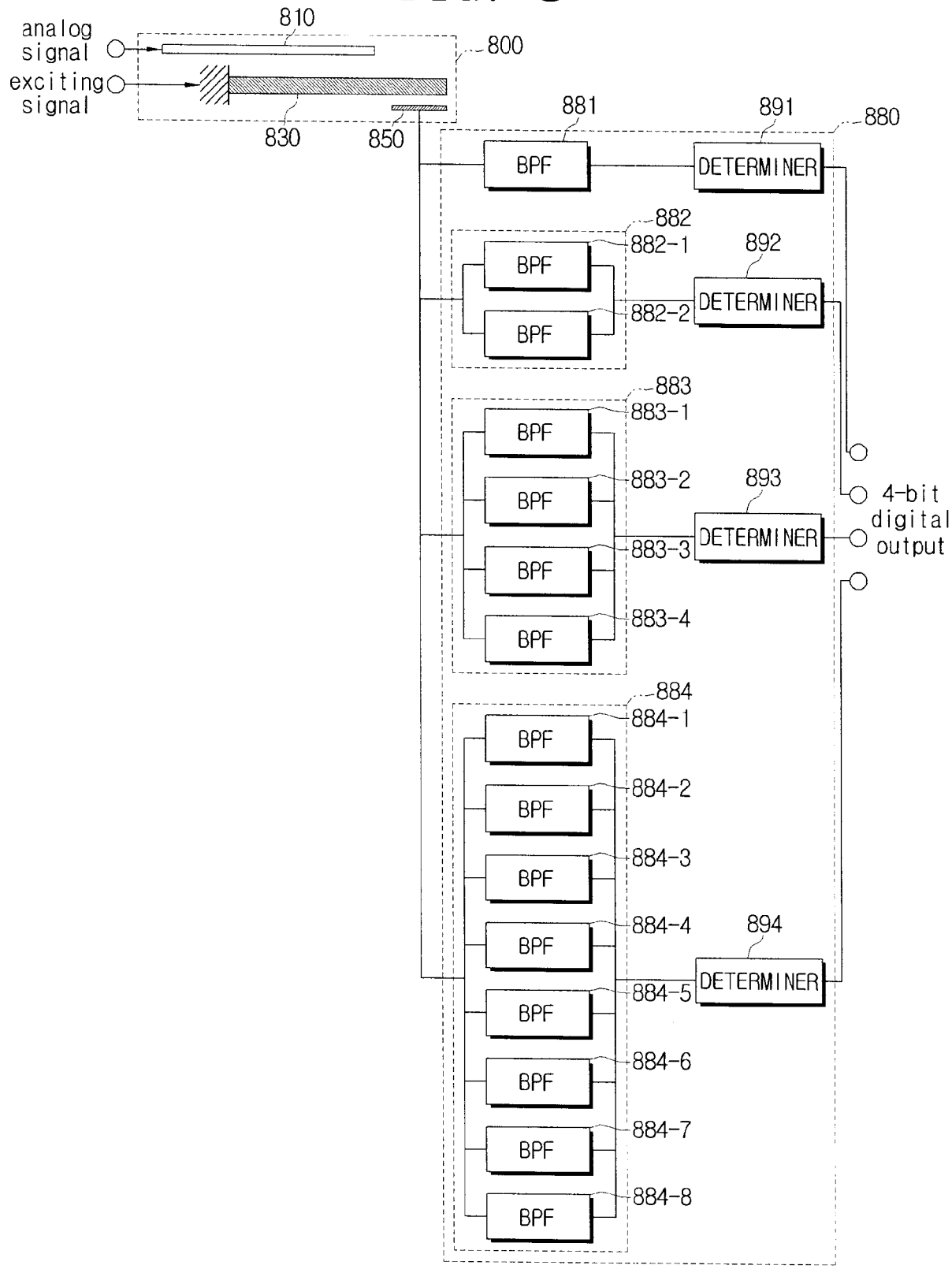
FIG. 8 is a diagram of a 4-bit AD converter which outputs a binary code using band pass filters according to yet another embodiment of the present invention.

Particularly, an AD converter for outputting a 4-bit binary code is illustrated by referring to FIGS. 8 through 11. FIG. 8 is a diagram of a 4-bit AD converter which outputs a binary code using BPFs according to yet another embodiment of the present invention.

The 4-bit AD converter of FIG. 8 includes a voltage detecting device 800 and a digital signal generator 880.

The voltage detecting device 800 includes a membrane 810, a resonator 830, and a detector 850 as in FIG. 1. The voltage detecting device 800 outputs an output signal of the frequency determined based on an analog signal input voltage.

The digital signal generator 880 includes a first filter group 881 through a fourth filter group 884, and a first determiner 891 through a fourth determiner 894.

The filter groups are arranged per bit. Each filter group includes a plurality of BPFs. The filter group corresponding to the i-th bit includes $2^{i-1}$-ary BPFs. For example, the first filter group 881 includes one BPF, the second filter group 882 includes two BPFs, the third filter group 883 includes four BPFs, and the fourth filter group 884 includes eight BPFs. The BPFs of the filter group are connected with each other in parallel.

Figure 9:
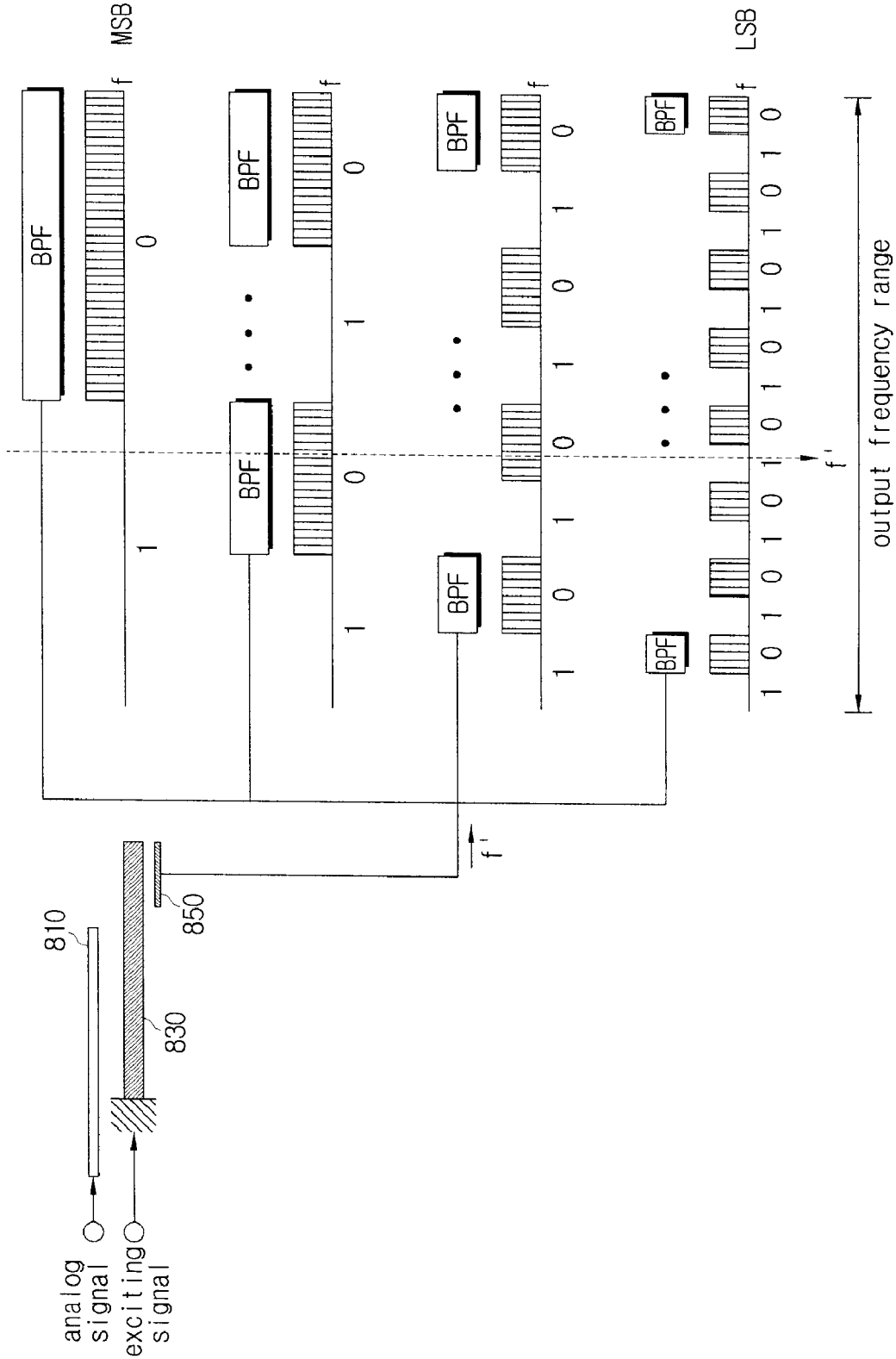
FIG. 9 is a diagram of frequency ranges passed by the band pass filters according to yet another embodiment of the present invention.

In FIGS. 8 and 9, a most significant bit (MSB) indicates the left-most bit and a least significant bit (LSB) indicates the right-most bit.

The BPFs in the second filter group 882 are referred to as a 2-1 BPF 882-1 and a 2-2 BPF 882-2, the BPFs in the third filter group 883 are referred to a 3-1 BPF 883-1 through a 3-4 BPF 883-4, and the BPFs in the fourth filter group 884 are referred to as a 4-1 BPF 884-1 through a 4-8 BPF 884-8.

When the output frequency range is divided to $2^i$-ary sub-regions, the BPFs of the filter group corresponding to the i-th bit pass the frequencies of the even sub-regions. Herein, the output frequency range is a region between the minimum frequency and a maximum frequency output from the voltage detecting device 800. For example, when the output frequency range is divided to eight ($=2^3$) sub-regions, the BPFs of the filter group corresponding to the third bit pass the frequencies of the even sub-regions (the second, fourth, sixth, and eighth sub-regions).

Since the BPFs in the filter group are connected in parallel, the output signal of the voltage detecting device 800, which passes through at least one BPF, is provided to the determiner.

The determiners 891 through 894 are arranged to the filter groups one by one. The determiners 891 through 894 determine whether the output signal of the voltage detecting device 800 passes through the filter groups 881 through 884. In other words, the determiners 891 through 894 determine whether there exists the output signal. The determiners 891 through 894 can be implemented using general signal detecting circuits or general voltage detecting circuits.

When the signal passes through the filter group, the determiners 891 through 894 output the voltage corresponding to the binary code '0'. When the filter group cuts off the signal, the determiners 891 through 894 output the voltage corresponding to the binary code '1'.

Now, the frequency band and the digital output value of the output signal passed through the BPFs are explained in more detail by referring to FIGS. 9 and 10.

FIG. 9 is a diagram of frequency ranges passed by the BPFs according to yet another embodiment of the present invention. The BPFs in FIG. 9 pass different frequency ranges. Reference numerals in FIG. 9 are the same as in FIG. 8. Thus, the reference numerals are omitted in FIG. 9.

When the output frequency range is divided to $2^i$-ary sub-regions, the BPFs of the filter group corresponding to the i-th bit pass frequencies of the even sub-regions. Hence, the first bit divides the output frequency range to a 1-1 sub-region and a 1-2 sub-region as shown in FIG. 9. The first BPF 881 of the first filter group passes the frequencies corresponding to the 1-2 sub-region.

The second bit divides the output frequency range to four sub-regions including a 2-1 sub-region through a 2-4 sub-region. The 2-1 BPF 882-1 of the second filter group 882 passes the frequencies corresponding to the 2-2 sub-region and the 2-2 BPF 882-2 passes the frequencies corresponding to the 2-4 sub-region.

Likewise, the third bit divides the output frequency range to eight sub-regions including a 3-1 sub-region through a 3-8 sub-region. In the third filter group 883, the 3-1 BPF 883-1 passes the frequencies corresponding to the 3-2 sub-region, the 3-2 BPF 883-2 passes the frequencies corresponding to the 3-4 sub-region, the 3-3 BPF 883-3 passes the frequencies corresponding to the 3-6 sub-region, and the 3-4 BPF 883-4 passes the frequencies corresponding to the 3-8 sub-region.

The fourth bit divides the output frequency range to sixteen sub-regions including a 4-1 sub-region through a 4-16 sub-region. In the fourth filter group 884, the 4-1 BPF 884-1 passes the frequencies corresponding to the 4-2 sub-region, the 4-2 BPF 884-2 passes the frequencies corresponding to the 4-4 sub-region, the 4-3 BPF 884-3 passes the frequencies corresponding to the 4-6 sub-region, the 4-4 BPF 884-4 passes the frequencies corresponding to the 4-8 sub-region, the 4-5 BPF 884-5 passes the frequencies corresponding to the 4-10 sub-region, the 4-6 BPF 884-6 passes the frequencies corresponding to the 4-12 sub-region, the 4-7 BPF 884-7 passes the frequencies corresponding to the 4-14 sub-region, and the 4-8 BPF 884-8 passes the frequencies corresponding to the 4-16 sub-region.

When the voltage detecting device 800 outputs the output signal of the frequency f' corresponding to the 4-7 sub-region, the output signal passes through the 2-1 BPF 882-1 of the second filter group 882 and the 3-2 BPF 883-2 of the third filter group 883. Since the output signal passes through the second filter group 882 and the third filter group 883, the digital output value becomes '1001'.

For example, it is assumed that the output frequency range is 0~800 Hz. The first BPF 881 passes 400~800 Hz. The 2-1 BPF 882-1 passes 200~400 Hz and the 2-2 BPF 882-2 passes 600~800 Hz. The 3-1 BPF 883-1 passes 100~200 Hz, the 3-2 BPF 883-2 passes 300~400 Hz, the 3-3 BPF 883-3 passes 500~600 Hz, and the 3-4 BPF 883-4 passes 700~800 Hz. The 4-1 BPF 884-1 passes 50~100 Hz, the 4-2 BPF 884-2 passes 150~200 Hz, the 4-3 BPF 884-3 passes 250~300 Hz, the 4-4 BPF 884-4 passes 350~400 Hz, the 4-5 BPF 884-5 passes 450~500 Hz, the 4-6 BPF 884-6 passes 550~600 Hz, the 4-7 BPF 884-7 passes 650~700 Hz, and the 4-8 BPF 884-8 passes 750~800 Hz.

When it is assumed that the output signal frequency f' of the voltage detecting device 800 is 330 Hz corresponding to the 4-7 sub-region, the 2-1 BPF 882-1 and the 3-2 BPF 883-2 pass the output signal. As a result, the digital output value becomes '1001'.

The higher analog signal input voltage applied to the voltage detecting device 800, the lower frequency of the output signal. As the output frequency of the voltage detecting device 800 moves to the left in the arrangement of the BPFs in FIG. 9, the binary code of FIG. 10 is output. As such, the analog signal can be converted to the digital signal.

FIG. 10 is a table of binary code output values according to yet another embodiment of the present invention. In this embodiment of the present invention, the digital output value is a binary code. As shown in FIG. 10, the binary code is output as the digital output value.

FIG. 11 is a table showing the number of filters based on the bits of the AD converter according to yet another embodiment of the present invention. The 4-bit AD converter of FIG. 8 includes fifteen filters. An N-bit AD converter includes ($2^N$−1)-ary filters.

Figure 12:
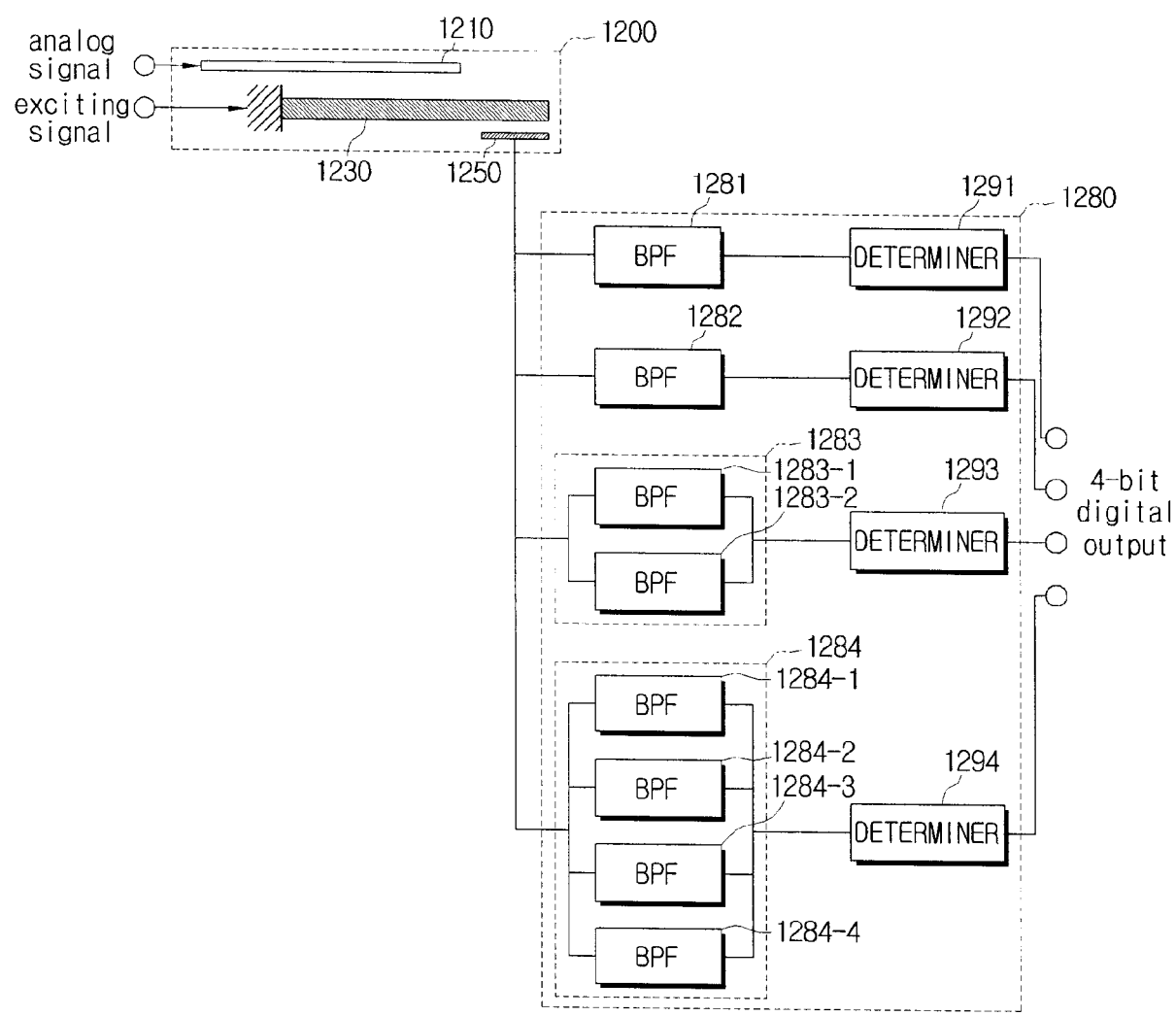
FIG. 12 is a diagram of a 4-bit AD converter which outputs a Gray code using band pass filters according to still another embodiment of the present invention.

Hereafter, an AD converter for outputting a 4-bit Gray code is illustrated by referring to FIGS. 12 through 15. FIG. 12 depicts a structure of a 4-bit AD converter which outputs a Gray code using BPFs according to still another embodiment of the present invention.

The 4-bit AD converter of FIG. 12 includes a voltage detecting device 1200 and a digital signal generator 1280.

The voltage detecting device 1200 includes a membrane 1210, a resonator 1230, and a detector 1250, similar to those in FIG. 1. The voltage detecting device 1200 outputs an output signal of the frequency determined based on the analog signal input voltage.

The digital signal generator 1280 includes a first filter group 1281 through a fourth filter group 1284, and a first determiner 1291 through a fourth determiner 1294.

The filter groups are disposed per bit. Each filter group includes a plurality of BPFs. The filter group corresponding to the i-th bit (i is a natural number greater than two) includes $2^{i-2}$-ary BPFs. Note that the filter group corresponding to the first bit includes only one BPF. Accordingly, the first filter group 1281 includes one BPF, the second filter group 1282 includes one BPF, the third filter group 1283 includes two BPFs, and the fourth filter group 1284 includes four BPFs. The BPFs in the filter group are connected with each other in parallel.

Figure 13:
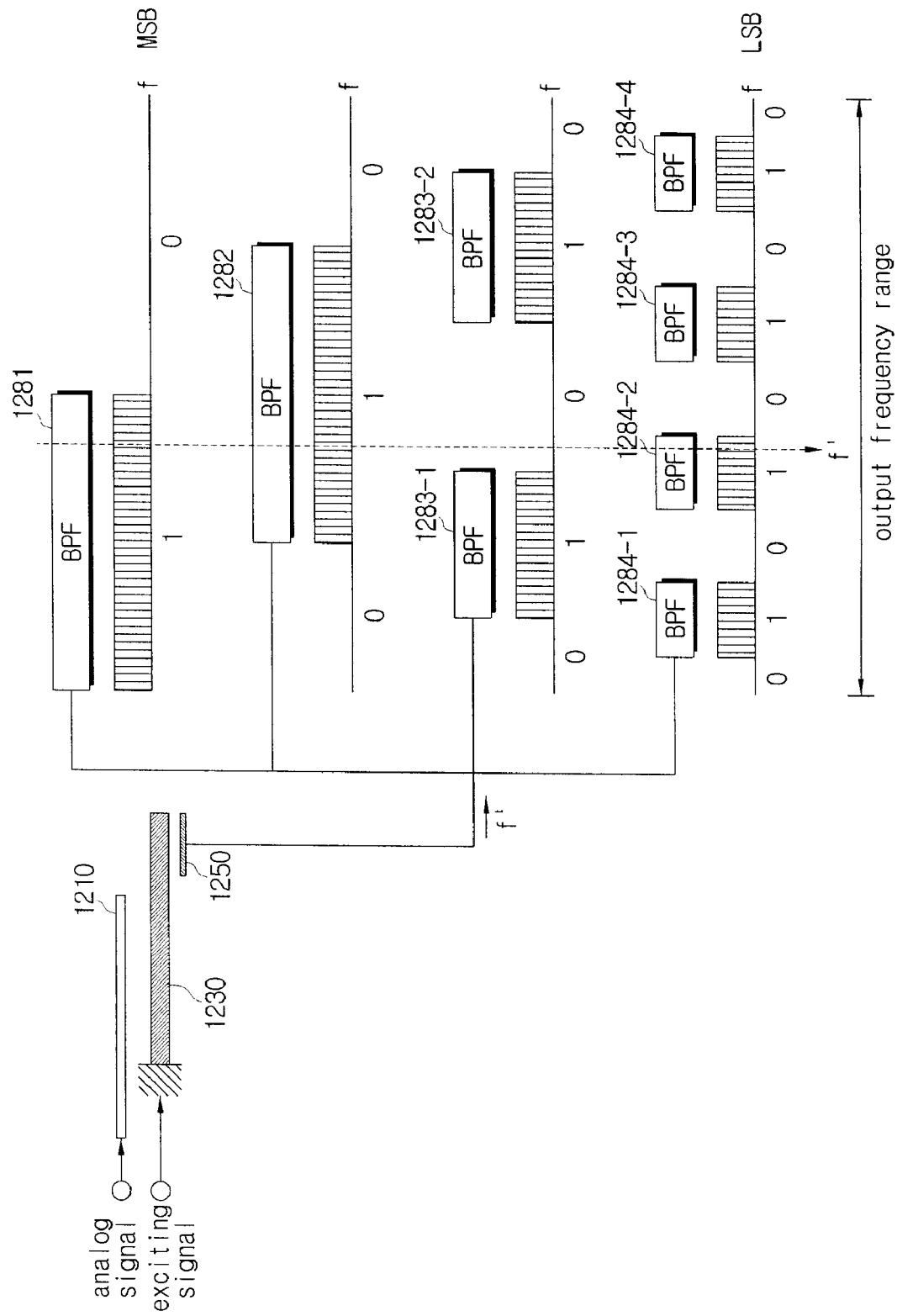
FIG. 13 is a diagram of frequency ranges passed by the band pass filters according to still another embodiment of the present invention.

In FIGS. 12 and 13, the MSB indicates the left-most bit and the LSB indicates the right-most bit.

The BPFs of the third filter group 1283 are referred to as a 3-1 BPF 1283-1 and a 3-2 BPF 1283-2, and the BPFs of the fourth filter group 1284 are referred to as a 4-1 BPF 1284-1 through a 4-4 BPF 1284-4.

When the output frequency range is divided to $2^i$-ary sub-regions, the BPFs in the filter group corresponding to the i-th bit (i is a natural number greater than two) passes the frequencies of (4j+2)-th sub-region and the (4j+3)-th sub-region (j is an integer and $0 \leq j < 2^{i-2}$). Note that the first BPF 1281 corresponding to the first bit passes the frequencies of the first sub-region when the output frequency region is divided to two sub-regions.

Herein, the output frequency range indicates a region between the minimum frequency and the maximum frequency output from the voltage detecting device 1200. For example, when the output frequency range is divided to eight (=$2^3$) sub-regions, the BPFs 1283-1 and 1283-2 of the filter group corresponding to the third bit pass the frequencies corresponding to the second, third, sixth, and seventh sub-regions.

Since the BPFs in the filter group are connected in parallel, the output signal of the voltage detecting device, which passes through at least one BPF, is provided to the determiner.

The determiners 1291 through 1294 are arranged for the filter groups one by one. The determiners 1291 through 1294 determine whether the output signal of the voltage detecting device 1200 passes through the filter groups 1281 through 1284. That is, the determiners 1291 through 1294 determine whether there exists the output signal. The determiners 1291 through 1294 can be implemented using general signal detecting circuits or general voltage detecting circuits.

When the signal goes through the filter group, the determiners 1291 through 1294 output the voltage corresponding to the binary code '1'. When the filter group cuts off the signal, the determiners 1291 through 1294 output the voltage corresponding to the binary code '0'.

Now, the frequency band and the digital output value (the Gray code) of the output signal passed by the BPFs are described in more detail by referring to FIGS. 13 and 14.

FIG. 13 is a diagram of frequency regions passed by the BPFs according to still another embodiment of the present invention. The BPFs of FIG. 13 pass different frequency ranges. Reference numerals in FIG. 13 are the same as in FIG. 12. The reference numerals are omitted in FIG. 13.

When the output frequency range is divided to two sub-regions, the first BPF 1281 of the filter group corresponding to the first bit passes the first sub-region. When the output frequency range is divided to $2^i$-ary sub-regions, the BPFs of the filter group corresponding to the i-bit (i is a natural number greater than two) pass the (4j+2)-th sub-region and the (4j+3)-th sub-region (j is an integer and $0 \geq j < 2^{i-2}$).

Accordingly, the first bit divides the output frequency range to a 1-1 sub-region and a 1-2 sub-region as shown in FIG. 13. The first BPF 1281 of the first filter group passes frequencies corresponding to the 1-1 sub-region.

The second bit divides the output frequency range to four sub-regions including a 2-1 sub-region through a 2-4 sub-region. The second BPF 1282 of the second filter group passes the frequencies corresponding to the 2-2 sub-region and the 2-3 sub-region.

Likewise, the third bit divides the output frequency range to eight sub-regions including a 3-1 sub-region through a 3-8 sub-region. The 3-1 BPF 1283-1 of the third filter group 1283 passes the frequencies corresponding to the 3-2 sub-region and the 3-3 sub-region, and the 3-2 BPF 1283-2 passes the frequencies corresponding to the 3-6 sub-region and the 3-7 sub-region.

The fourth bit divides the output frequency range to sixteen sub-regions including a 4-1 sub-region through a 4-16 sub-region. In the fourth filter group 1284, the 4-1 BPF 1284-1 passes the frequencies of the 4-2 sub-region and the 4-3 sub-region, the 4-2 BPF 1284-2 passes the frequencies of the 4-6 sub-region and the 4-7 sub-region, the 4-3 BPF 1284-3 passes the frequencies of the 4-10 sub-region and the 4-11 sub-region, and the 4-4 BPF 1284-4 passes the frequencies of the 4-14 sub-region and the 4-15 sub-region.

When the voltage detecting device 1200 outputs the output signal of the frequency f' corresponding to the 4-7 sub-region in FIG. 13, the output signal goes through the second BPF 1282 of the second filter group 1282 and the 4-2 BPF 1284-2 of the fourth filter group 1284. Since the output signal goes through the second filter group 1282 and the fourth filter group 1284, the digital output value becomes '1101'.

For example, when it is assumed that the output frequency range is 0~800 Hz, the first BPF 1281 passes 0~400 Hz. The second BPF 1282 passes 200~600 Hz, the 3-1 BPF 1283-1 passes 100~300 Hz, and the 3-2 BPF 1283-2 passes 500~700 Hz. The 4-1 BPF 1284-1 passes 50~150 Hz, the 4-2 BPF 1284-2 passes 250~350 Hz, the 4-3 BPF 1284-3 passes 450~550 Hz, and the 4-4 BPF 1284-4 passes 650~750 Hz.

When it is assumed that the output signal frequency f' of the voltage detecting device 1200 is 330 Hz corresponding to the 4-7 sub-region, the second BPF 1282 and the 4-2 BPF 1284-2 pass the output signal. Thus, the digital output value becomes '1101'.

The higher analog signal input voltage applied to the voltage detecting device 1200, the lower frequency of the output signal. In the BPF arrangement of FIG. 13, as the output frequency of the voltage detecting device 1200 moves to the left the Gray code of FIG. 14 is produced. Therefore, the analog signal can be converted to the digital signal.

FIG. 14 is a table showing Gray code output values according to still another embodiment of the present invention. In this embodiment of the present invention, the digital output value corresponds to the Gray code. As shown in FIG. 14, the Gray code is output as the digital output value.

In the Table of FIG. 14, the Gray code output values are arranged. Unlike the binary code, the Gray code changes only one bit in the next code. For example, the next Gray code of '0001' is '0011'. That is, only the third bit is changed from '0' to '1'. The next Gray code of '0011' is '0010' where only the fourth bit is changed from '1' to '0'. The next Gray code of '0010' is '0110' where only the second bit is changed from '0' to '1'.

Unlike the binary code, the Gray code changes only one bit in the next code to thus minimize the error. Also, its structure can be simplified by reducing the total number of the BPFs. However, since the decimal values corresponding to the Gray codes are not in order, it is necessary to rearrange the decimal values in order.

FIG. 15 is a table showing the number of filters based on the bits of the AD converter according to still another embodiment of the present invention. As shown in FIG. 12, the 4-bit AD converter includes eight filters in total. An N-bit AD converter includes $2^{N-1}$-ary filters. By outputting the Gray code, the AD converter can be implemented using the smaller number of filters than the AD converter according to the yet another embodiment of the present invention.

So far, the AD converters using the BPFs have been illustrated by referring to FIGS. 8 through 15.

While the BPFs pass the frequencies of the even sub-regions in the yet another embodiment, the BPFs can pass the frequencies of the odd sub-regions.

While the detector outputs the voltage signal, the detector can output a different signal of the same frequency as the resonance frequency. For instance, the detector may output a signal using the change of the capacitance, and distance information by measuring the distance between the resonator and the detector.

It should be understood that the AD converter can be implemented using other methods than the methods of the above embodiments of the present invention. Specifically, the present invention is applicable to any AD converter capable of determining the digital output value '0' or '1' using the frequency of the output signal from the resonator.

As set forth above, the AD converter determines the digital output value based on the resonance frequency set based on the magnitude of the input voltage. Therefore, the AD converter can achieve the high resolution and the high speed with much lower power consumption.

More specifically, without using the reference resistance and the comparator, the n-bit converter is implemented using the MEMS resonator. As a result, the AD converter can achieve the high resolution with even lower power consumption.

While the invention has been shown and described with reference to certain embodiments thereof, it will be understood by those skilled in the art that various changes in form and details may be made therein without departing from the spirit and scope of the invention as defined by the appended claims and the full scope of equivalents thereof.

What is claimed is:

1. An analog-to-digital (AD) converter comprising:
   at least one voltage detecting device for outputting a signal of a frequency determined based on a magnitude of an input voltage; and
   a digital signal generator for determining a digital output value according to an output signal from the voltage detecting device,
   wherein the voltage detecting device comprises:
     a membrane to which the input voltage is applied;
     a resonator disposed away from the membrane by a certain distance for shifting a resonance frequency based on the magnitude of the input voltage applied to the membrane; and
     a detector for outputting a signal of the same frequency as the resonance frequency of the resonator.

2. The AD converter of claim 1, wherein the detector comprises:
   a conductive plate apart from the resonator by a certain distance, and
   the detector outputs a voltage signal of the same frequency as the resonance frequency of the resonator.

3. The AD converter of claim 1, further comprising:
   a reference frequency generator which comprises a reference resonator for resonating at a reference frequency and a reference detector for outputting a signal of the same frequency as the reference frequency of the reference resonator, and generates a reference frequency signal using the reference resonator and the reference detector.

4. The AD converter of claim 3, wherein the digital signal generator determines the digital output value by comparing the frequency of the output signal from the voltage detecting device with a magnitude of the reference frequency.

5. The AD converter of claim 4, wherein the digital signal generator determines a thermometer code 1 when the frequency of the output signal is smaller than the reference frequency, and determines a thermometer code 0 when the frequency of the output signal is greater than the reference frequency.

6. The AD converter of claim 1, wherein the voltage detecting device corresponding to a lower bit produces a lower frequency of the output signal.

7. The AD converter of claim 6, wherein the voltage detecting device corresponding to a lower bit has a greater area overlapped by the membrane and the resonator, and produces a lower frequency of the output signal.

8. The AD converter of claim 7, wherein, in the voltage detecting device corresponding to a lower bit, the membrane is lengthened in one direction and an area overlapped by the membrane and the resonator increases.

9. The AD converter of claim 6, wherein, in the voltage detecting device corresponding to a lower bit, the resonator is lengthened in one direction and the frequency of the output signal is lowered.

10. The AD converter of claim 1, wherein a number of the voltage detecting devices is one, and
    the digital signal generator comprises one or more band pass filters (BPFs) and determines the digital output value according to whether the output signal from the voltage detecting device passes through the BPFs.

11. The AD converter of claim 10, wherein the BPFs constitute filter groups as many as bits of the digital output value, and
    BPFs belonging to one filter group are connected with each other in parallel.

12. The AD converter of claim 11, wherein the filter group corresponding to an i-th bit (i is a natural number) comprises $2^{i-1}$-ary BPFs.

13. The AD converter of claim 12, wherein the voltage detecting device outputs the output signal of the frequency within an output frequency range between a minimum frequency and a maximum frequency which are output based on the input signal, and
    when the output frequency range is divided to $2^i$-ary sub-regions, the filter group corresponding to the i-th bit comprises $2^{i-1}$-ary BPFs which pass frequencies of even sub-regions.

14. The AD converter of claim 13, wherein the digital signal generator outputs a binary code.

15. The AD converter of claim 11, wherein a filter group corresponding to a first bit comprises one BPF, and a filter group corresponding to an i-th bit (i is a natural number greater than 2) comprises $2^{i-2}$-ary BPFs.

16. The AD converter of claim 15, wherein the voltage detecting device outputs the output signal of a frequency within an output frequency range between a minimum frequency and a maximum frequency which are output based on the input signal,
    a filter of the filter group corresponding to the first bit passes frequencies of a first sub-region when the output frequency range is divided two sub-regions, and
    filters of the filter group corresponding to the i-th bit (i is a natural number greater than 2) pass frequencies of (4j+2)-th and (4j+3)-th sub-regions (j is an integer and $0 \leq j < 2^{i-2}$) when the output frequency range is divided to $2^i$-ary sub-regions.

17. The AD converter of claim 16, wherein the digital signal generator outputs a Gray code.

18. The AD converter of claim 11, wherein the digital signal generator outputs the digital output value 1 of the filter group which passes the output signal, and outputs the digital output value 0 of the filter group which does not pass the output signal.

19. The AD converter of claim 11, wherein the digital signal generator outputs the digital output value 0 of the filter group which passes the output signal, and outputs the digital output value 1 of the filter group which does not pass the output signal.

* * * * *